United States Patent [19]
Ruetz

[11] Patent Number: 5,254,961
[45] Date of Patent: * Oct. 19, 1993

[54] LOW-POWER CRYSTAL CIRCUIT

[75] Inventor: J. Eric Ruetz, San Bruno, Calif.

[73] Assignee: Samsung Semiconductor, Inc., San Jose, Calif.

[*] Notice: The portion of the term of this patent subsequent to Oct. 13, 2009 has been disclaimed.

[21] Appl. No.: 960,599

[22] Filed: Oct. 13, 1992

Related U.S. Application Data

[63] Continuation of Ser. No. 704,745, May 23, 1991, Pat. No. 5,155,453.

[51] Int. Cl.[5] .............................................. H03B 5/36
[52] U.S. Cl. .............................. 331/116 FE; 331/74; 331/116 R; 331/117 R; 331/158
[58] Field of Search .................... 331/74, 109, 116 R, 331/116 FE, 117 R, 117 FE, 158, 159, 182, 183, DIG. 3

[56] References Cited

U.S. PATENT DOCUMENTS

| | | | |
|---|---|---|---|
| 4,328,571 | 5/1982 | Noble | 368/87 |
| 4,896,122 | 1/1990 | Tahernia | 331/158 |
| 4,928,314 | 5/1990 | Grandfield et al. | 455/236 |
| 5,155,451 | 10/1992 | Gladden et al. | 331/116 FE X |

FOREIGN PATENT DOCUMENTS 0301649  2/1989  European Pat. Off. .

Primary Examiner—David Mis
Attorney, Agent, or Firm—Townsend and Townsend Khourie and Crew

[57] ABSTRACT

A crystal oscillator circuit has a sleep mode of operation that reduces power consumption while maintaining oscillation to provide for a fast transition to a normal mode of operation.

4 Claims, 2 Drawing Sheets

LOW-POWER CRYSTAL CIRCUIT

This is a continuation of application Ser. No. 704,745 filed May 28, 1991, now U.S. Pat. No. 5,155,453.

BACKGROUND OF THE INVENTION

The present invention relates generally to crystal oscillator circuits and, more particularly, relates to a crystal oscillator circuit employing a power saving sleep mode.

Crystal oscillator circuits have many applications, one of the most common being to provide a clock signal required by a digital system. Most systems have required electrical characteristics for the clock signal such as the voltage swing, typically from 0 to 5 volts, and the output current drive.

The crystal oscillator circuit consumes a substantial amount of current, typically on the order of milliamps, to achieve the required characteristics. For systems utilizing a battery as a power supply the current consumed by the crystal oscillator circuit is a substantial load on the battery and reduces battery life.

Accordingly, many battery-powered portable systems, such as laptop computers, turn off the crystal oscillator circuit when the clock signal is not required. However, when the crystal oscillator is turned back there is a delay, typically on the order of milliseconds, before the output signal is stable and exhibits the required electrical characteristics. In certain applications, this delay is undesirable and adversely affects the operation of the system.

SUMMARY OF THE INVENTION

The present invention is a crystal oscillator having a sleep mode for reducing power consumption and that almost instantaneously generates an oscillating output signal having required electrical characteristics when switched back to a normal mode of operation.

In the sleep mode the amount of current supplied to the amplifier is sufficient to maintain oscillation of the crystal, but the current level is not sufficient to generate an oscillator output signal having required electrical characteristics. However, this maintained oscillation facilitates a very fast transition to a normal mode when the amount of current supplied to the amplifier is increased to a level sufficient to generate an oscillator output signal having required electrical characteristics.

Other advantages and features of the invention will become apparent in view of the appended drawings and following detailed description.

DESCRIPTION OF THE PREFERRED EMBODIMENTS

Figure 1:
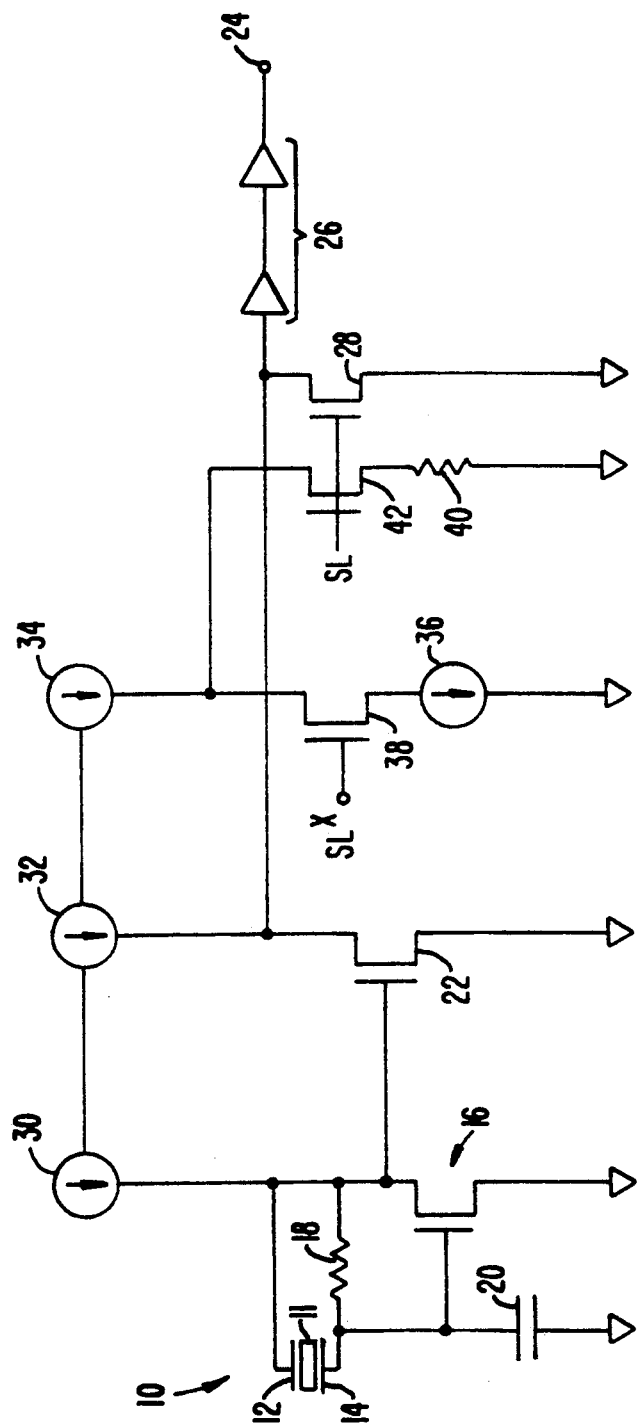
FIG. 1 is a schematic diagram of a preferred embodiment of the invention.

FIG. 1 is a functional schematic diagram of a preferred embodiment of the invention. A crystal oscillator circuit 10 includes a crystal 11, disposed between capacitive crystal input plates 12 and 14, a first amplifier 16 having its input coupled to the first crystal input 12 and its output coupled to the second crystal input 14. An RC feedback network comprising a feedback resistor 18 and a capacitor 20 couples the output of the first amplifier 16 to its input. A second amplifier 22 has its input coupled to the output of the first amplifier 16 and it output coupled to an oscillator output terminal 24 by a driver circuit 26 and to ground via a first switching transistor 28.

First, second, and third current sources 30, 32, and 34 are coupled in a current mirror configuration. The first and second current sources 30 and 32 provide current to drive the first and second amplifiers 16 and 22. The third current source is coupled to a normal mode biasing current source 36 via a second switching transistor 38 and to a sleep mode bleeder resistor 40 via a third switching transistor 42. The control inputs of the first and third switching transistors 28 and 42 are connected to receive a sleep mode signal (SL) and the control input of the second switching transistor is connected to receive an inverted sleep mode signal (SL*).

The operation of the system depicted in FIG. 1 will now be described. In normal operation SL is low and SL* is high so that the output of the second amplifier is isolated from ground and the third current source 34 is coupled to the normal mode biasing source 36 to bias the third current source 34 to conduct a large, normal mode current. The third current source then biases the first and second current sources provide a large amount of current to the first and second amplifiers 16 and 22. These large currents cause the output voltages generated by the first and second amplifiers to be at sufficiently high levels to cause voltage swing of the oscillator output signal at the output terminal 24 to be at the operational level, typically between 0 and 5 volts.

In the sleep mode SL is high and SL* is low so that the output of the second amplifier 22 is tied to ground and the third current source 34 is coupled to the bleeder resistor 40. A very small amount of current flows through the resistor 40 so that the current flow through the current mirror coupled current sources 30, 32, and 34 is substantially reduced below the normal mode levels. This current reduction lowers the output voltage level of the first amplifier 16 to a level sufficient to maintain the oscillation the crystal oscillator but not at the level required to maintain the operational voltage swing of the output signal. Further, the second amplifier is shut down because its output is coupled to ground.

The low level of current supplied by the current sources 30, 32, and 34 during the sleep mode substantially reduces the power consumed by the crystal oscillator 10. However, because oscillation of the crystal is maintained, the output voltage can be returned to the full operational level in a matter of microseconds. Thus, the system reduces the delay caused by switching from the sleep mode to the normal mode by an order of magnitude.

Typically, digital circuitry is coupled to the oscillator output and is toggled by the output signal. Each time the coupled digital circuitry is toggled power is consumed. It is possible that the low voltage output signal provided during the sleep mode could still cause this coupled circuitry to toggle and consume power. The coupling of the output of the second amplifier 22 to ground during the sleep mode assures that no oscillating output signal is present at the output terminal 24 to prevent toggling of the coupled digital circuitry.

Figure 2:
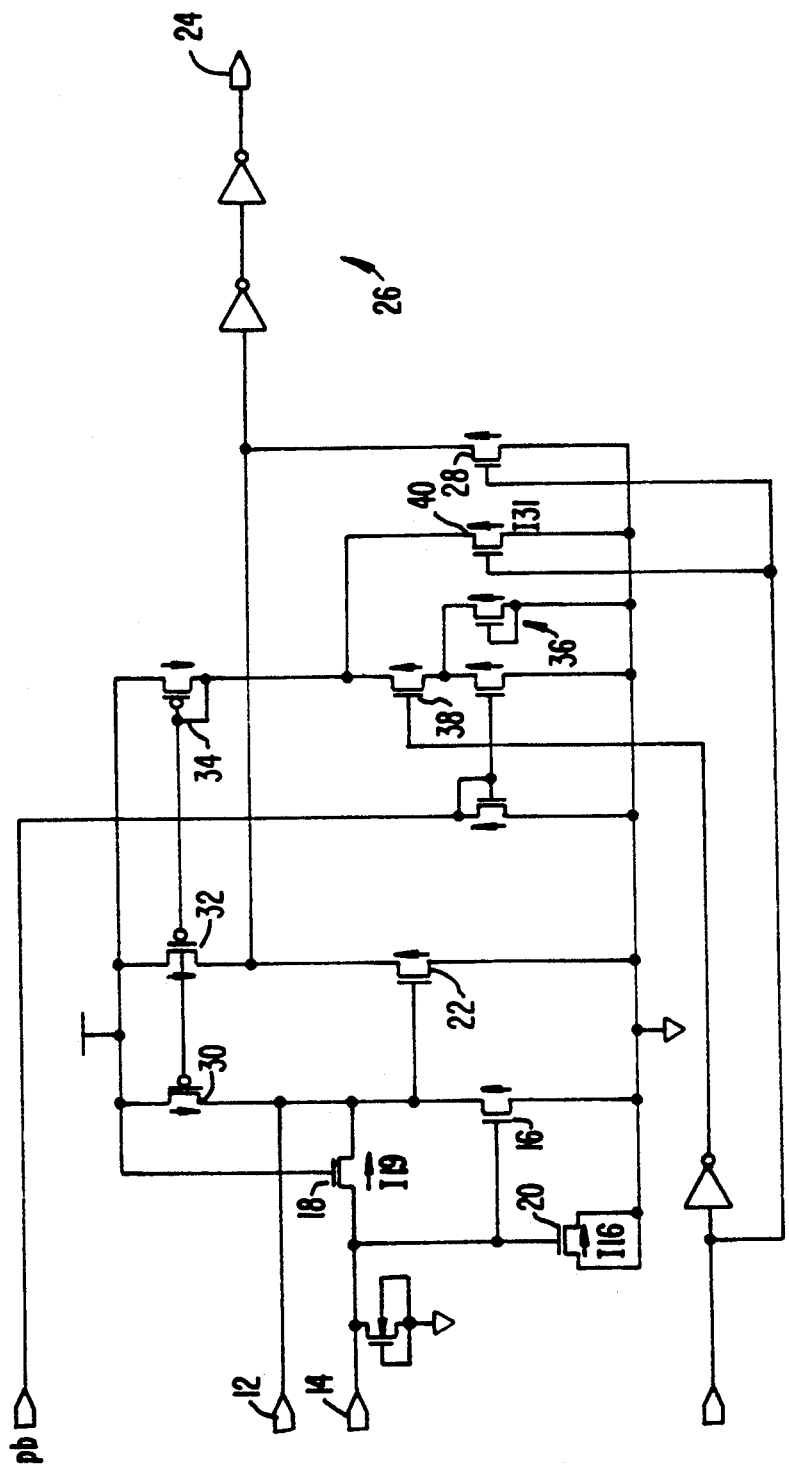
FIG. 2 is a circuit diagram of an implementation of the embodiment depicted in FIG. 1.

FIG. 2 is a circuit diagram of a CMOS circuit implementing the system depicted in FIG. 1. The same reference numerals are utilized to depict identical or corresponding parts. In FIG. 1, the feedback transistor 18, capacitor 20, and switching transistor 28 are implemented as NMOS transistors 119, 116, 131 respectively. A bias current is provided at the pb input of the circuit. The remaining circuit elements are implemented in a standard manner.

In the circuit depicted in FIG. 2, it would take several milliseconds to generate a stable output signal after completely turning off the oscillator, however, when utilizing the sleep mode disclosed herein the recovery time is a few microseconds. Further, during normal operation the power consumption is about 3 milliamps and is sleep mode it is about 50 microamps.

The invention has now been described with reference to the preferred embodiments. Alternatives and substitutions will now be apparent to persons of ordinary skill in the art. For example, the various functional elements depicted in FIG. 1 may be realized in a variety of standard configurations. Accordingly, it is not intended to limit the invention except as provided by the appended claims.

What is claimed is:

1. A crystal oscillator system including a crystal for providing an oscillator output signal having required electrical characteristics, said system comprising:
   an amplifier circuit for driving the crystal and providing the oscillator output signal;
   an amplifier current source for supplying current to the amplifier circuit;
   a variable current supply means coupled to the amplifier current source in a current mirror configuration, said variable current supply means consisting of a first bias circuit for biasing the amplifier current source to supply a high level current to the amplifier circuit to drive the crystal to produce the oscillator output signal, and a second bias circuit for biasing the amplifier current source to supply a low current to the amplifier circuit, said low level current not being sufficient to drive the crystal to produce the oscillator output signal but being sufficient to maintain crystal oscillation;
   a select circuit for selecting the first bias circuit to operate the crystal circuit in a normal operation mode and for selecting the second bias circuit to operate the crystal circuit in a sleep operation mode.

2. The crystal oscillator system of claim 1 further comprising:
   a means for decoupling the oscillator output signal from the external system during sleep mode so that digital circuitry coupled to the oscillator output cannot be toggled by the low level current of the oscillator output signal thus saving powder drain.

3. A crystal oscillator circuit for generating an oscillating output signal required by an external system, with the oscillator circuit having a crystal coupled between an input and output of an amplifier, said amplifier being driven by an amplifier current source, and providing an output voltage for driving the crystal, a system for implementing a sleep mode to conserve power when the oscillating output signal is not required and for quickly recovering from the sleep mode when the oscillating output signal is again required, said system comprising:
   a current supply means, coupled to the amplifier current source in a current mirror configuration, said current supply means being able to bias the amplifier current source to supply a normal mode level of current to the amplifier to bias the amplifier output voltage to generate the required oscillating signal and a sleep mode level of current, being substantially smaller than the normal mode level of current, to bias the amplifier output voltage to a level sufficient to maintain oscillation in the crystal; and
   a current control means, responsive to an external control signal, for selecting the normal mode current supply means when the oscillating output signal is required and for selecting the sleep mode current supply means when the oscillating output signal is not required.

4. The crystal oscillator circuit of claim 3 further comprising:
   a means for decoupling the oscillating output signal from the external system during sleep mode so that digital circuitry coupled to the oscillator output cannot be toggled by the low level current of the oscillating output signal thus saving power drain.

* * * * *